United States Patent
Tanaka et al.

(10) Patent No.: US 7,288,287 B2
(45) Date of Patent: Oct. 30, 2007

(54) CIRCUIT FORMATION PART AND MANUFACTURING METHOD FOR THIS CIRCUIT FORMATION PART

(75) Inventors: Hirokazu Tanaka, Kyoto (JP); Satoshi Hirono, Kyoto (JP)

(73) Assignee: Omron Corporation, Kyoto-Shi (JP)

( * ) Notice: Subject to any disclaimer, the term of this patent is extended or adjusted under 35 U.S.C. 154(b) by 326 days.

(21) Appl. No.: 10/467,338

(22) PCT Filed: Mar. 2, 2001

(86) PCT No.: PCT/JP01/01637

§ 371 (c)(1),
(2), (4) Date: Dec. 12, 2003

(87) PCT Pub. No.: WO02/070780

PCT Pub. Date: Sep. 12, 2002

(65) Prior Publication Data

US 2004/0112634 A1 Jun. 17, 2004

(51) Int. Cl.
*B05D 3/06* (2006.01)
(52) U.S. Cl. ............... 427/304; 427/306; 427/316; 427/322; 427/431; 427/443.1; 204/157.61
(58) Field of Classification Search ............... 428/209, 428/901; 174/250–258; 427/304, 306, 316, 427/322, 431, 443.1; 204/157.61
See application file for complete search history.

(56) References Cited

U.S. PATENT DOCUMENTS

| | | | | |
|---|---|---|---|---|
| 4,080,513 A | * | 3/1978 | Cuneo et al. ............... | 174/255 |
| 4,615,907 A | | 10/1986 | Boeke et al. | |
| 4,959,119 A | * | 9/1990 | Lantzer ............... | 216/65 |
| 4,981,715 A | * | 1/1991 | Hirsch et al. ............... | 427/555 |
| 5,684,065 A | * | 11/1997 | Hiraoka et al. ............. | 523/300 |
| 5,817,404 A | * | 10/1998 | Kawakita et al. ........... | 428/209 |
| 6,518,514 B2 | * | 2/2003 | Suzuki et al. ............... | 174/262 |
| 6,730,857 B2 | * | 5/2004 | Konrad et al. ............... | 174/257 |
| 6,797,345 B2 | * | 9/2004 | Okamoto et al. ............ | 428/1.6 |

FOREIGN PATENT DOCUMENTS

JP 63-186877 A 8/1988

(Continued)

*Primary Examiner*—Cathy F. Lam
(74) *Attorney, Agent, or Firm*—Foley & Lardner LLP (57) ABSTRACT

The insulating layer formation step of forming an insulating layer 24-1 on a base for resin application 20 by applying polymeric material, which has been diluted with a solvent, filled with inorganic filler to the base for resin application and by drying the base for resin application; the circuit formation portion forming step of creating a circuit formation portion and a via hole 25 in insulating layer 24-1 that has been formed in the above described insulating layer formation step by means of a laser treatment; and the circuit formation step of forming a circuit 23-1 by plating the circuit formation portion and via hole 25 that have been created in the above described circuit formation portion forming step are provided and the insulating layer formation step, the circuit formation portion forming step and the circuit formation step are repeated a plurality of times in this order and, thereby, a circuit formation part (multi-layered substrate) is manufactured. Accordingly, a multi-layered circuit, even of more than three layers, having an arbitrary circuit formation can easily be manufactured at a low cost.

9 Claims, 4 Drawing Sheets

FOREIGN PATENT DOCUMENTS

| | | |
|---|---|---|
| JP | 04-183873 A | 6/1992 |
| JP | 08-264957 A | 10/1996 |
| JP | 09-36522 A | 2/1997 |
| JP | 2000-212755 A | 8/2000 |
| JP | 2000-212756 A | 8/2000 |
| JP | 2000-212793 A | 8/2000 |

* cited by examiner

CIRCUIT FORMATION PART AND MANUFACTURING METHOD FOR THIS CIRCUIT FORMATION PART

TECHNICAL FIELD

The present invention relates to a circuit formation part manufactured by using a plating method for a polymeric mold wherein an insulating layer is formed on the polymeric mold and wherein electroless plating as well as electrolytic plating are carried out after the above described insulating layer has been irradiated with a laser and relates to a manufacturing method thereof.

BACKGROUND TECHNOLOGY

A conventional method for plating of polymeric material is, in general, a method wherein a tin-palladium compound is absorbed by the surface of a mold made of polymeric material after the surface has been roughened by chemicals, palladium is reduced and, finally, electroless plating is carried out. In addition, an exposure method using a photoresist is used in order to partially plate a circuit pattern, or the like.

In addition, these two steps are repeated and, thereby, multi-layered substrates, which are widely used for electronic apparatuses, are manufactured.

That is to say, pre-drying is carried out in the via formation step after the application of an insulating layer 61 to a substrate 60, as shown in FIGS. 5(1) to 5(6), exposure (negative) treatment 64 is carried out for development and, after that, main drying is carried out. Next, insulating layer 61 is etched (roughened) in the pretreatment step, as shown in FIGS. 5(7) to 5(9) and undergoes a catalyzing step and an acceleration step. Next, electroless plating or electrolytic plating subsequent to electroless plating is carried out on the pretreated insulating layer 61 in the patterning step, as shown in FIGS. 5(10) to 5(15), and a resist 62 is applied, an exposure (positive) treatment 65 is carried out for development and, after that, Cu is etched and resist 62 is removed so as to gain a circuit pattern 63 made of a plated layer.

In addition, though the partial plating method for an injected mold circuit part (MID) is same as described above, multiple layers of plating on an injected mold circuit part by means of an exposure method is not implemented because an appropriate resist material or an application method does not exist for a three-dimensional part and a three-dimensional exposure is technically and productively difficult.

In addition, though a combination of double plating and an exposure method carried out on the surface of the outermost layer has been proposed as another means for formation of multiple layers on an injected mold circuit part, only three layers can be formed and circuit formation is extremely limited using this means.

Many manufacturing steps are required, however, for the manufacture of a multi-layered substrate using the above described conventional method for plating a polymeric material and an exposure method utilizing a photoresist and a multi-layered substrate cannot easily be manufactured and, moreover, a maximum of only three layers can be formed according to multi-layered formation on an injected mold circuit part such that there is a problem wherein circuit formation is extremely limited and the cost of manufacture becomes high.

The present invention is provided to solve the above described problems and the first purpose thereof is to provide a circuit formation part wherein polymeric material filled with inorganic filler is diluted with a solvent and is applied to a base for resin application and, then, is dried so as to form an insulating layer and, thereby, plating by means of surface treatment with a laser becomes possible in a manner such that a circuit for a multi-layered substrate is formed from this plating.

In addition, the second purpose of the present invention is to provide a circuit formation part that has an arbitrary circuit form and wherein a multi-layered circuit, even of three or more layers, can be gained and that can easily be reduced in size and in weight, that can easily be increased in density and that has excellent EMC characteristics.

In addition, the third purpose of the present invention is to provide a manufacturing method for a circuit formation part, wherein a circuit formation part having an arbitrary circuit form and having a multi-layered circuit in three-dimensions, even of three or more layers, can easily be manufactured at a low cost.

DISCLOSURE OF THE INVENTION

In order to achieve the above described first purpose a circuit formation part according to the present invention is formed such that polymeric material filled with inorganic filler is diluted with solvent and is applied to a base for resin application and is dried so as to form an insulating layer and, after that, the surface of the insulating layer is irradiated with a laser so that a positive potential is created in the portion irradiated with the laser and, then, a catalyst for electroless plating is deposited on the portion irradiated with the laser and, after that, the base for resin application is submerged in an electroless plating liquid so that an electroless plating layer is formed such that the electroless plating layer is formed on the portion irradiated with the laser.

In addition, in accordance with a circuit formation part according to the present invention, polymeric material filled with inorganic filler is diluted with solvent and is applied to a base for resin application and is dried so as to form an insulating layer and, after that, the surface of the insulating layer is irradiated with a laser so that the portion irradiated with the laser is converted to a conductive state and, after that, electrolytic plating is carried out so that an electrolytic plating layer is formed such that the electroless plating layer is formed on the portion irradiated with the laser.

Here, it is preferable for the above described inorganic filler to be glass in a granular form or ceramic in a granular form having a diameter of from 0.1 μm to 10 μm of which the amount added to the polymeric material is from 10 wt. % to 50 wt. % and for the above described laser to have a wavelength of 600 nm, or less, and for the total energy of said irradiated laser to be from 10 J/cm$^2$ to 500 J/cm$^2$. In addition, it is preferable for the above described polymeric material to be polyimide or epoxy resin.

Accordingly, polymeric material filled with inorganic filler is diluted with solvent and is applied to a base for resin application that includes a polymeric mold and is dried so as to form an insulating layer and, thereby, electroless plating or electrolytic plating by means of a surface treatment with a laser become possible and such electroless plating or electrolytic plating is used to form a circuit pattern so that a multi-layered substrate or a circuit formation part can easily be formed at a low cost.

In addition, in order to achieve the above described second purpose a circuit formation part according to the present invention is provided with: an insulating layer formed by applying polymeric material, which has been diluted with a solvent, filled with inorganic filler to a base for resin application that includes a polymeric mold and by drying the base for resin application; a circuit formation portion and a via hole created in this insulating layer by means of a laser treatment; and a circuit formed by carrying out plating on the circuit formation portion and on the via hole.

In addition, a circuit formation part is formed such that: a base for resin application that includes a polymeric mold has a recess; polymeric material filled with inorganic filler is diluted with a solvent and is applied to the surface of the recess and is dried so that an insulating layer is formed; a circuit formation portion and a via hole are created in this insulating layer by means of a laser treatment; plating is carried out on the circuit formation portion and on the via hole so as to form a circuit; and procedures as above are repeated a plurality of times so that a multi-layered circuit is formed in the recess.

Here, the plating may be an electroless plating that is carried out by submerging the insulating layer in an electroless plating liquid after the insulating layer has been irradiated with the laser so that a positive surface potential is created in this portion irradiated with the laser and, then, a catalyst for the electroless plating is deposited on the portion irradiated with the laser or the plating may be electrolytic plating carried out by submerging the insulating layer in an electrolytic plating liquid after the insulating layer has been irradiated with the laser so that this portion irradiated with the laser is converted to a conductive state.

Here, it is preferable for the inorganic filler to be glass in a granular form or ceramic in a granular form having a diameter of from 0.1 µm to 10 µm of which the amount added to the polymeric material is from 10 wt. % to 50 wt. % and for the laser to have a wavelength of 600 nm, or less, and for the total energy of the irradiated laser to be from 10 J/cm$^2$ to 500 J/cm$^2$.

In addition, the polymeric material of the polymeric mold may be liquid crystal polymer, polyethersulfone, polybutylene terephthalate, polycarbonate, polyphenylene ether, polyphenylene oxide, polyacetal, polyethylene terephthalate, polyamide, acrylonitrile-butadiene-styrene (ABS), polyphenylene sulfide, polyetherimide, polyetherether ketone, polysulfone, polyimide, epoxy resin or a composite resin thereof.

In accordance with the above described configuration a circuit formation part that has an arbitrary circuit form and wherein a multi-layered circuit, even of three or more layers, can be gained and that can easily be reduced in size and in weight, that can easily be increased in density and that has excellent EMC characteristics can be gained.

In addition, in order to achieve the above described third purpose a manufacturing method for a circuit formation part according to the present invention is provided with: the insulating layer formation step of forming an insulating layer by applying polymeric material, which has been diluted with a solvent, filled with inorganic filler to a base for resin application that includes a polymeric mold and by drying the polymeric mold; the circuit formation portion formation step of creating a circuit formation portion and a via hole in this insulating layer that has been formed in the insulating layer formation step by means of a laser treatment; and the circuit formation step of forming a circuit by carrying out plating on the circuit formation portion and the via hole that have been created in this circuit formation portion formation step, wherein a circuit formation part having a multi-layered circuit is manufactured by repeating the insulating layer formation step, the circuit formation portion formation step and the circuit formation step a plurality of times according to this order.

Here, it is preferable for the circuit formation part to be a multi-layered substrate. In addition, the plating may be an electroless plating that is carried out by submersing the insulating layer in an electroless plating liquid after the insulating layer has been irradiated with the laser so that a positive surface potential is created in this portion irradiated with the laser and, then, a catalyst for the electroless plating is deposited on the portion irradiated with the laser, or the plating may be electrolytic plating carried out by submersing the insulating layer in an electrolytic plating liquid after the insulating layer has been irradiated with the laser so that this portion irradiated with the laser is converted to a conductive state.

Here, it is preferable for the inorganic filler to be glass in a granular form or ceramic in a granular form having a diameter of from 0.1 µm to 10 µm of which the amount added to the polymeric material is from 10 wt. % to 50 wt. % and for the laser to have a wavelength of 600 nm, or less, and for the total energy of said irradiated laser to be from 10 J/cm$^2$ to 500 J/cm$^2$.

In addition, the polymeric material of the polymeric mold may be liquid crystal polymer, polyethersulfone, polybutylene terephthalate, polycarbonate, polyphenylene ether, polyphenylene oxide, polyacetal, polyethylene terephthalate, polyamide, acrylonitrile-butadiene-styrene (ABS), polyphenylene sulfide, polyetherimide, polyetherether ketone, polysulfone, polyimide, epoxy resin or a composite resin thereof.

Accordingly, a circuit formation part having an arbitrary circuit form and having a multi-layered circuit in three-dimensions, even of three or more layers, can easily be manufactured at a low cost.

BRIEF DESCRIPTION OF THE DRAWINGS

FIGS. 1(1) to 1(3) are diagrams showing the steps of a plating method for a polymeric mold according to the present invention and FIG. 1(4) is a diagram showing the step of a plating method for a polymeric mold wherein electrolytic plating is used according to the present invention;

FIGS. 2(1) to 2(4) are diagrams showing the steps of a manufacturing method for a circuit formation part (multi-layered substrate) according to the present invention;

FIGS. 5(1) to 5(15) are diagrams showing the steps of a manufacturing method for a multi-layered substrate according to a prior art.

BEST MODE FOR CARRYING OUT THE INVENTION

A plating method for a polymeric mold according to the present invention is described.

A polymeric material (polyimide, for example) filled with 10 wt. % to 50 wt. % of inorganic filler is diluted with a solvent (xylene, for example) and is applied to a base for resin application 20 and is dried so as to form an insulating layer 21 and, after that, the surface of this insulating layer 21 is irradiated with a laser R having a wavelength of 600 nm, or less, so that a positive potential is created in this portion irradiated with the laser 22 and, after that, base 20 for resin application is submerged in a precious metal solution (solution that includes anionic Pd compounds or Pd colloids, for example) so that a catalyst (Pd, for example) alone, for electroless plating, is deposited on portion irradiated with the laser 22 and, after that, electroless plating is carried out by submersing base for resin application 20 in the electroless plating liquid and, thereby, an electroless plating layer 23 is formed on portion irradiated with the laser 22 in accordance with a plating method for a polymeric mold according to the present invention as shown in FIGS. 1(1) to 1(3).

In addition, a polymeric material (polyimide, for example) filled with 10 wt. % to 50 wt. % of inorganic filler is diluted with a solvent (xylene, for example) and is applied to a base for resin application 20 and is dried so as to form an insulating layer 21 and, after that, the surface of this insulating layer 21 is irradiated with a laser R having a wavelength of 600 nm, or less, so that this portion irradiated with the laser 22 is converted to a conductive state and, after that, electrolytic plating is carried out and, thereby, an electrolytic plating layer 23' is formed on portion irradiated with the laser 22 in accordance with a plating method for a polymeric mold according to the present invention as shown in FIG. 1(4).

Glass filler, ceramic granules, and the like, can be cited as inorganic fillers having a fiber form with a diameter of from 1 μm to 20 μm and with a length of no less than 10 μm or having a granular form with a diameter of from 0.5 μm to 2.0 μm and it becomes possible to further restrict debris from scattering in the case that the amount of inorganic filler added to the polymeric material is from 10 wt. % to 50 wt. %.

In addition, lasers having a wavelength of no less than 600 nm such as an excimer laser (wavelength $\lambda=193$ nm, 248 nm, 308 nm or 351 nm), YAG second harmonic wave (wavelength $\lambda=532$ nm), YAG third harmonic wave (wavelength $\lambda=355$ nm) can be utilized as the above laser.

In addition, the charged condition of the region irradiated with the laser becomes appropriate for the deposit of precious metals when the total energy projected by the laser is from 10 J/cm$^2$ to 500 J/cm$^2$ in the case of electroless plating and the conductivity of the region irradiated with the laser becomes appropriate for the formation of an electrolytic plating layer in the case of electrolytic plating.

In the case of electroless plating the irradiation condition of the laser can be set so that the fluency (amount of energy per unit area per unit pulse: J/cm$^2$/1 pulse) and the number of times of irradiation are such that a charged condition appropriate for the deposit of precious metal is generated. Thereby, the charged condition of debris generated by means of abrasion in the region irradiated with the laser becomes appropriate so that it becomes possible to have an appropriate deposition of precious metals wherein electroless plating can be carried out on the entire surface of the region irradiated with the laser.

In addition, in the case of electrolytic plating the irradiation condition of the laser can be set so that the fluency (amount of energy per unit area per unit pulse: J/cm$^2$/1 pulse) and the number of times of irradiation are such that a conductive state that is appropriate for electrolytic plating in the region irradiated with the laser is generated.

In addition, insulating layer 21 is submerged in an anionic precious metal solution in the case of electroless plating. In this case a palladium solution wherein $PdCl_2$ powder is dissolved in ion exchanged water, wherein $Na_2PdCl_4$ powder is dissolved in ion exchanged water or wherein $PdCl_2$ powder and NaCl powder are dissolved in ion exchanged water, a palladium colloidal solution wherein palladium chloride, sodium chloride, polyethylene glycol mono-P-nonylphenyl ether and borated sodium fluoride are mixed, or the like, can be utilized as the precious metal solution that can be utilized.

Precious metal is deposited only on the region irradiated with the laser of insulating layer 21 according to such a pre-treatment method and electroless plating is subsequently carried out and, thereby, an electroless plating layer 23 is formed only on this region.

In addition, in the case of electrolytic plating, only the region irradiated with the laser of insulating layer 21 is converted to the conductive state as described above and electrolytic plating is subsequently carried out and, thereby, an electrolytic plating layer 23' is formed only on this region.

Accordingly, a polymeric material filled with inorganic filler is diluted with a solvent and is applied to base for resin application 20 and is dried so as to form insulating layer 21 and, thereby, electroless plating or electrolytic plating by means of a surface treatment with a laser becomes possible so that a substrate can be formed wherein this electroless plating or electrolytic plating is used for a circuit (conductive pattern) according to the above described plating method for a polymeric mold.

Next, a multi-layered substrate, as a circuit formation part according to the present invention, and a manufacturing method for the same are described.

A multi-layered substrate is provided with: an insulating layer 21 formed by applying polymeric material, which has been diluted with a solvent, filled with inorganic filler to a base for resin application 20 and by drying the base for resin application 20; a circuit formation portion (not shown) and a via hole 25 created in this insulating layer 21 by means of a laser treatment; and a circuit 23-1 (23'-1) formed by plating the circuit formation portion and the via hole 25.

Here, the plating method is either electroless plating or electrolytic plating, which is the same plating method for a polymeric mold according to the present invention as described above.

That is to say, polymeric material (polyimide, for example) filled with inorganic filler of 10 wt. % to 50 wt. % is diluted with a solvent (xylene, for example) and is applied to base 20 for resin application and by drying the base for resin application 20 so as to form an insulating layer 21 and, after that, the surface of this insulating layer 21 is irradiated with laser R having a wavelength of no greater than 600 nm so as to create a positive potential in this portion irradiated with the laser 22 and, subsequently, base for resin application 20 is submerged in a precious metal solution (solution that includes anionic Pd compounds or Pd colloids, for example) so that a catalyst (Pd, for example) alone, for electroless plating, is deposited on portion irradiated with the laser 22 and, after that, the above described electroless plating is carried out by submerging base for resin application 20 in the electroless plating liquid or polymeric material (polyimide, for example) filled with inorganic filler of 10 wt. % to 50 wt. % is diluted with a solvent (xylene, for example) and is applied to base for resin application 20 and by drying the base for resin application 20 so as to form an insulating layer 21 and, after that, the surface of this insulating layer 21 is irradiated with laser R having a wavelength of no greater than 600 nm so as to convert this portion irradiated with the laser 22 to the conductive state and, after that, the above described electrolytic plating is carried out.

Thus, the manufacture of a multi-layered substrate is carried out by repeating the following steps a plurality of times in this order: the insulating layer formation step for forming an insulating layer by applying polymeric material, which has been diluted with a solvent, filled with inorganic filler to a polymeric mold and by drying the polymeric mold; the circuit formation portion forming step of forming a circuit formation portion and a via hole in the insulating layer formed in the insulating layer formation step by means of a laser treatment; and the circuit formation step of forming a circuit by forming a plating layer on the circuit formation portion and on the via hole created in the circuit formation portion forming step.

FIG. 2(1) shows the condition wherein an electroless plating layer 23 is formed on the surface of an insulating layer 21 that has been formed by applying polymeric material (polymeric material filled with 10% to 50% of inorganic filler) to base for resin application 20 and by drying the base for resin application 20 as described above and, in addition, only the region of the polymeric mold irradiated with a laser is converted into the conductive state as described above and, after that, electrolytic plating is carried out and, after that, a circuit 23' made of an electrolytic plating layer is formed on only this region by carrying out electrolytic plating.

Next, polymeric material filled with 10% to 50% of inorganic filler is diluted with a solvent and is applied again to the surface of insulating layer 21 and is dried as shown in FIG. 2(2) so that first insulating layer 24-1 is formed.

Next, the surface of first insulating layer 24-1 is irradiated with a laser having a wavelength of no greater than 600 nm so as to create a positive potential in this portion irradiated with the laser and via hole 25 is created in first insulating layer 24-1 by means of a laser so that a positive potential is created in the surface around this via hole 25.

After that, the substrate is submerged in a solution including anionic Pd compounds or Pd colloids so that, as shown in FIG. 2(3), a circuit 23-1 made of a first electroless plating layer and a land 26, which connects circuit 23 made of an electroless plating layer with circuit 23-1 made of the first electroless plating layer, are formed on the portion that has been irradiated with a laser (circuit formation portion) and on via hole 25 using Pd as a nucleus. In addition, in the case of electrolytic plating the portion that has been irradiated with a laser (circuit formation portion) and the surface around via hole 25 in the polymeric mold are converted to the conductive state as described above and, after that, electrolytic plating is carried out and, thereby, a circuit 23'-1 made of a first electrolytic plating layer and a land 26', which connects circuit 23' made of the electrolytic plating layer with circuit 23'-1 made of the first electroless plating layer, are formed.

Next, as shown in FIG. 2(4), polymeric material filled with 10% to 50% of inorganic filler is again diluted with a solvent and is applied to the first insulating layer 24-1 wherein circuit 23-1 (23'-1) and land 26 have been formed as described above and is dried so that a second insulating layer 24-2 is formed.

Next, the surface of this second insulating layer 24-2 is irradiated with a laser having a wavelength of no greater than 600 nm so as to create a positive potential in this portion irradiated with the laser and a via hole 25 is created in the second insulating layer 24-2 by means of the laser so as to create a positive potential on the surface around this via hole 25.

After that, the substrate is submersed in a solution including anionic Pd compounds or Pd colloids so that a circuit 23-2 made of the second electroless plating layer and a land 26 that connects circuit 23-1 made of the first electroless plating layer with circuit 23-2 made of the second electroless plating layer are formed in the portion that has been irradiated with the laser (circuit formation portion) and on via hole 25 using Pd as a nucleus. In addition, in the case of electrolytic plating, the portion of polymeric mold 21 that has been irradiated with the laser (circuit formation portion) and the surface around via hole 25 are converted to the conductive state as described above and, after that, electrolytic plating is carried out so as to form a circuit 23'-2 made of the second electrolytic plating layer and a land 26,' which connects circuit 23'-1 made of the first electrolytic plating layer with a circuit 23'-2 made of the second electroless plating layer.

In the following these steps are repeated so as to form multiple layers (three layers in FIG. 2(4)) of circuits 23-1, 23-2, 23-3 made of electroless plating layers or circuits 23'-1, 23'-2, 23'-3 made of electrolytic plating layers so as to manufacture a multi-layered substrate.

Accordingly, multiple layers, even more than three layers of circuits having an arbitrary circuit form, can be gained and a multi-layered substrate can be gained that can easily be reduced in size and in weight, that can easily be increased in density and that has excellent EMC characteristics.

In addition, a three-dimensional multi-layered substrate having an arbitrary circuit form and even having more than three layers can easily be manufactured at a low cost according to this manufacturing method for a multi-layered substrate.

Figure 1:
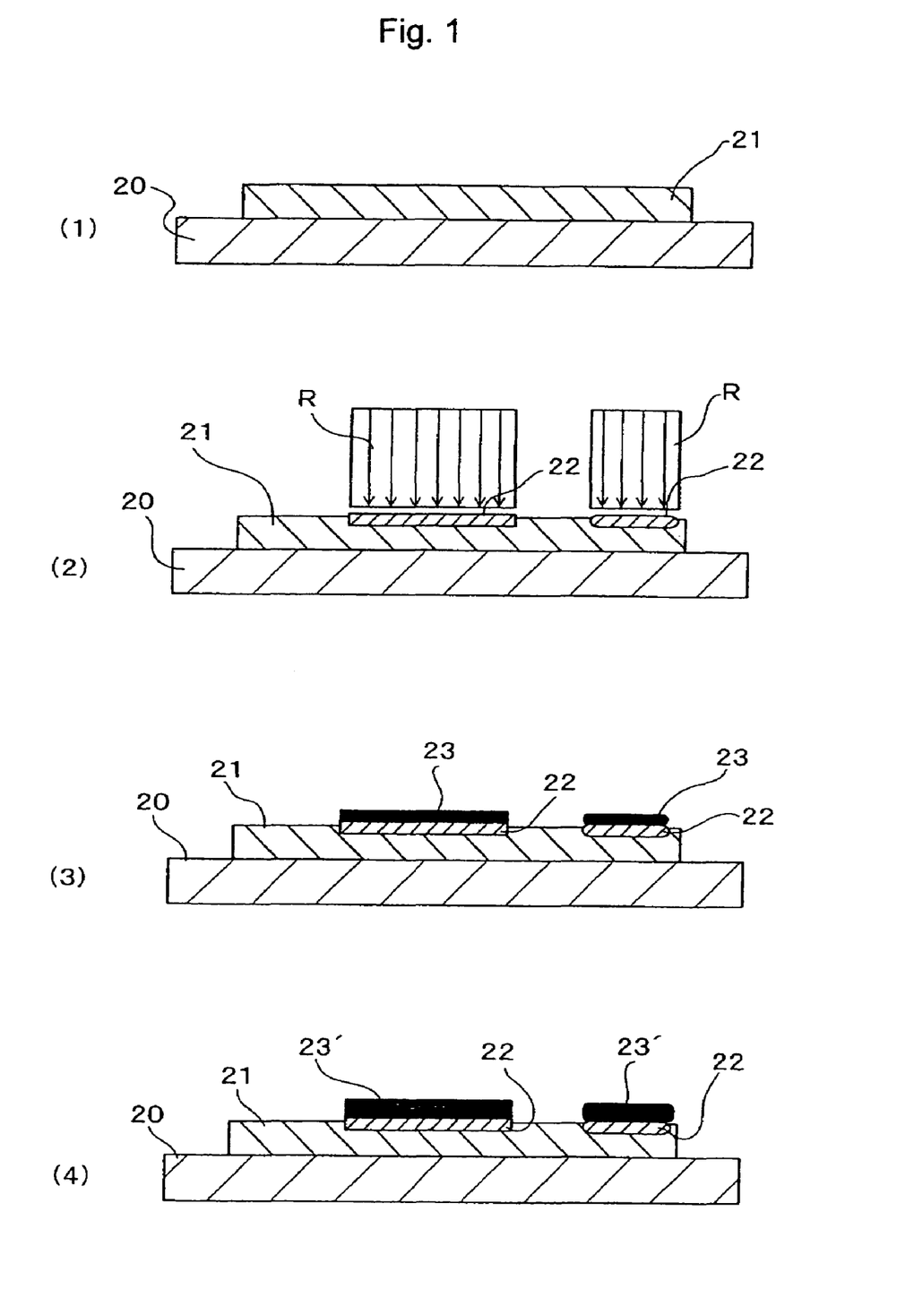
Figure 2:
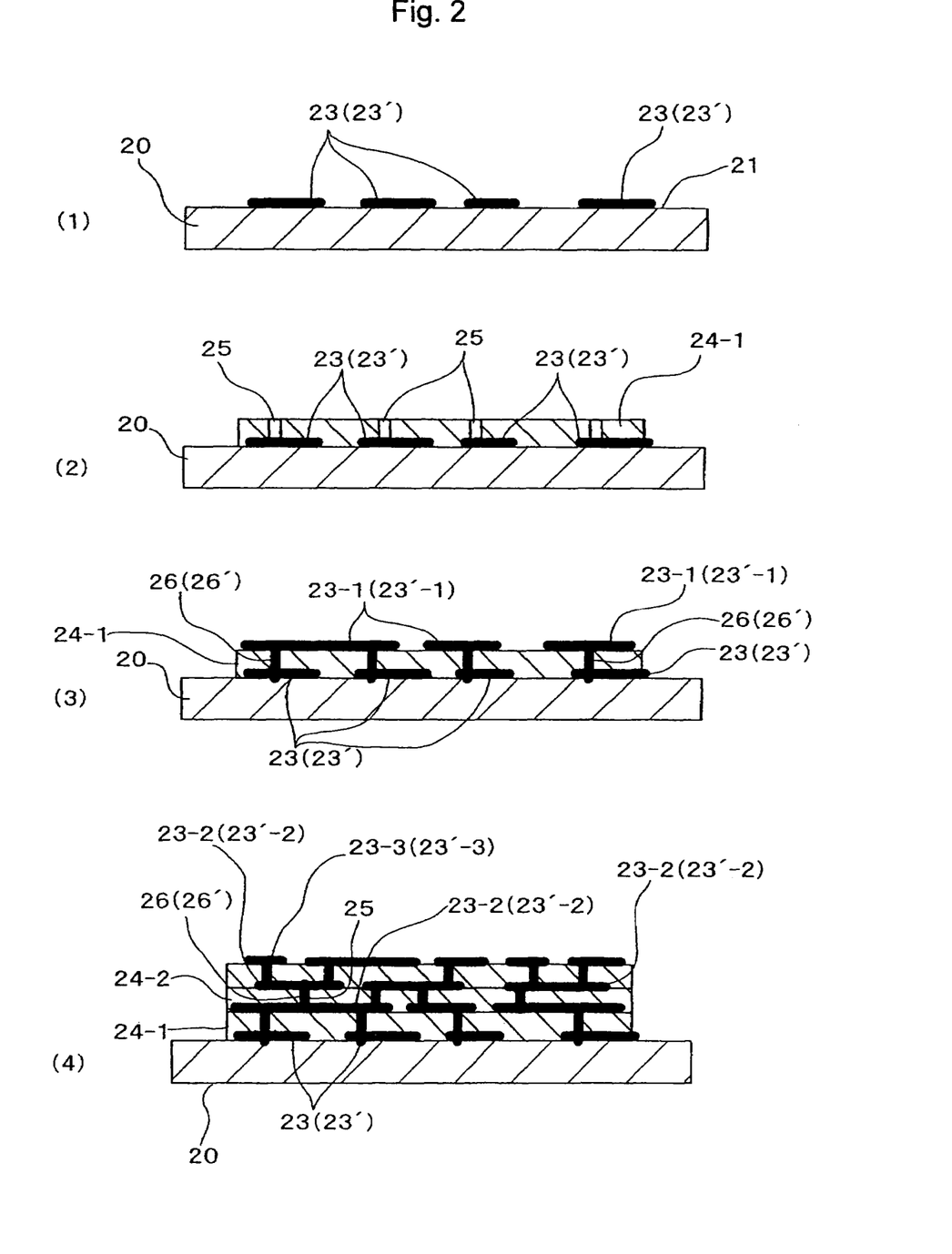
Figure 3:
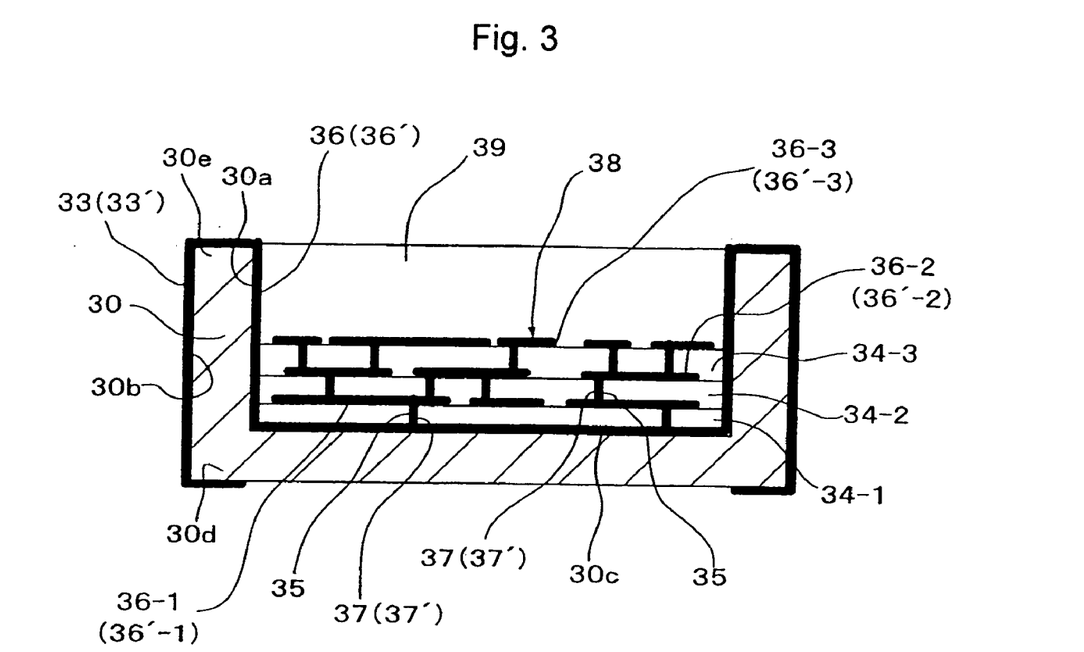
FIG. 3 is a diagram showing the configuration of a circuit formation part according to the present invention.

Next, the part shown in FIG. 3 as a circuit formation part according to the present invention is described.

In this circuit formation part, a polymeric mold 30 has a recess 39 wherein an insulating layer 34-1 is formed on the surface of recess 39 by applying polymeric material, which has been diluted with a solvent, filled with inorganic filler to the surface of recess 39, which is dried, and circuit formation portions as well as via holes 35 are created in this insulating layer 34-1 by means of a laser treatment and plating is carried out on the circuit formation portions and via holes 35 so as to form circuits 36-1 (36'-1) and these steps are repeated a plurality of times so that multiple layers of circuits are formed in recess 39 and lands 33 (33') are formed ranging from the multiple layers of circuits to the outside of the polymeric mold.

Here, the plating is electroless plating or electrolytic plating, which is the same plating method for a polymeric mold according to the present invention as described above.

That is to say, polymeric material (polyimide, for example) filled with 10 wt. % to 50 wt. % of inorganic filler is diluted with a solvent (xylene, for example) and is applied to the surface of recess 39 of polymeric mold 30 and is dried so as to form an insulating layer 34-1 and, after that, the surface of this insulating layer 34-1 is irradiated with laser R having a wavelength of no greater than 600 nm so as to create a positive potential in this portion that has been irradiated with the laser and, subsequently, the polymeric mold is submerged in a precious metal solution (solution that includes anionic Pd compounds or Pd colloids, for example) so that a catalyst (Pd, for example) for electroless plating, alone, is deposited on the portion that has been irradiated with the laser and, after that, the above described electroless plating is carried out by submerging the polymeric mold in an electroless plating liquid or polymeric material (polyimide, for example) filled with 10 wt. % to 50 wt. % of inorganic filler is diluted with a solvent (xylene, for example) and is applied to the surface of recess 39 and is dried so as to form an insulating layer 34-1 and, after that, the surface of this insulating layer 34-1 is irradiated with laser R having a wavelength of no greater than 600 nm so as to convert this portion irradiated with the laser to the conductive state and, after that, the above described electrolytic plating is carried out.

In this case liquid crystal polymer (LCP), polyethersulfone, polybutylene terephthalate, polycarbonate, polyphenylene ether, polyphenylene oxide, polyacetal, polyethylene terephthalate, polyamide, acrylonitrilebutadiene-styrene (ABS), polyphenylene sulfide, polyetherimide, polyetherether ketone, polysulfone, polyimide, epoxy resin or a composite resin thereof may be used for the polymeric material of polymeric mold 30.

Thus, the circuit formation part is manufactured as follows.

First, a circuit 36 made of an electroless plating layer (or circuit 36' made of an electrolytic plating layer) is formed on the inner side surfaces 30a and on the bottom surface 30c of recess 39 of polymeric mold 30.

That is to say, the inner side surfaces 30a and on the bottom surface 30c of recess 39 of polymeric mold 30 are irradiated with a laser having a wavelength of no greater than 600 nm so as to create a positive potential in this irradiated portion and, after that, the polymeric mold is submerged in a solution that includes anionic Pd compounds or Pd colloids so that a circuit 36 made of an electroless plating layer is formed on the irradiated portion using Pd as a nucleus.

In addition, in the case of electrolytic plating, the inner side surfaces 30a and on the bottom surface 30c of recess 39 of polymeric mold 30 are irradiated with a laser in order to be converted to the conductive state as described above and, after that, electrolytic plating is carried out so as to form a circuit 36' made of an electrolytic plating layer in this region.

Next, polymeric material filled with 10% to 50% of inorganic filler is diluted with a solvent and is applied to the surface of the bottom of recess 39 of polymeric mold 30 and is dried so as to form a first insulating layer 34-1.

Next, the surface of this insulating layer 34-1 is irradiated with a laser having a wavelength of no greater than 600 nm so as to create a positive potential in this portion that has been irradiated with the laser and a via hole 35 is created in first insulating layer 34-1 by means of a laser so as to create a positive potential on the surface around this via hole 35.

After that, the polymeric mold is submerged in a solution including anionic Pd compounds or Pd colloids so as to form a circuit 36-1 made of a first electroless plating layer and land 37 that connects circuit 36 made of an electroless plating layer with circuit 36-1 made of the first electroless plating layer in the portion that has been irradiated with the laser and in via hole 35 using Pd as a nucleus. In addition, in the case of electrolytic plating, the portion that has been irradiated with the laser and the portion around via hole 35 are converted to the conductive state as described above and, after that, electrolytic plating is carried out so as to form circuit 36'-1 made of the first electrolytic plating layer and a land 37' that connects circuit 36' made of an electrolytic plating layer with circuit 36'-1 made of the first electrolytic plating layer.

Next, polymeric material filled with 10% to 50% of inorganic filler is diluted with a solvent and is again applied to insulating layer 34-1 wherein circuit 36-1 (or circuit 36'-1) and land 37 (or land 37') are formed as described above and is dried so as to form a second insulating layer 34-2.

Next, the surface of this second insulating layer 34-2 is irradiated with a laser having a wavelength of no greater than 600 nm so as to create a positive potential in this portion that has been irradiated with the laser and via hole 35 is created in second insulating layer 34-2 by means of a laser so as to create a positive potential on the surface around this via hole 35.

After that, the polymeric mold is submerged in a solution including anionic Pd compounds or Pd colloids so as to form a circuit 36-2 made of a second electroless plating layer and a land 37 that connects circuit 34-1 made of the first electroless plating layer with 36-2 made of the second electroless plating layer in the portion that has been irradiated with the laser and in via hole 35 using Pd as a nucleus. In addition, in the case of electrolytic plating, the portion that has been irradiated with the laser and the surface around via hole 35 are converted to the conductive state as described above and, after that, electrolytic plating is carried out so as to form a circuit 36'-2 made of a second electrolytic plating layer and a land 37' that connects circuit 36'-1 made of the first electrolytic plating layer with circuit 36'-2 made of the second electrolytic plating layer.

In the following these steps are repeated and, thereby, circuits 36-1, 36-2, 36-3 made of multiple layers of electroless plating layers or circuits 36'-1, 36'-2, 36'-3 made of electrolytic plating layers are formed in recess 39 of polymeric mold 30 so as to manufacture a multi-layered circuit formation portion 38.

Next, a land 33 made of an electroless plating layer (or land 33' made of an electrolytic plating layer) is formed on top portion 30e, on outer periphery portion 30b and on the outside portion of the bottom 30d of polymeric mold 30 so that this land 33 (33') is connected to multi-layered circuit formation portion 38 via circuit 36 (36').

As described above polymeric material filled with inorganic filler is diluted with a solvent and is applied to the surface of polymeric mold 30, which is made of polymeric material, and is dried so as to form an insulating layer 34-1 and a circuit formation portion as well as via hole 35 are created on insulating layer 34-1 by means of a laser treatment and a circuit 36-1 (36'-1) is formed in the circuit formation portion and in via hole 35 by carrying out plating, and this procedure is repeated a plurality of times and, thereby, a multi-layered circuit formation portion 38 is formed on the surface of polymeric mold 30 so that three-dimensional multi-layered, even of more than three layers, circuit formation portion 38 having an arbitrary circuit form can be gained wherein a circuit formation part can be gained and that can easily be reduced in size and in weight, that can easily be increased in density and that has excellent EMC characteristics can be gained.

In addition, according to the manufacturing method for a circuit formation part, polymeric material filled with inorganic filler is diluted with a solvent and is applied to polymeric mold 30 and is dried so as to form insulating layer 34-1 and, thereby, it becomes possible to form a circuit 36-1 (36'-1) made of an electroless plating or of an electrolytic plating by means of a surface treatment with a laser so that a circuit formation part having an arbitrary circuit formation can be manufactured.

Figure 4:
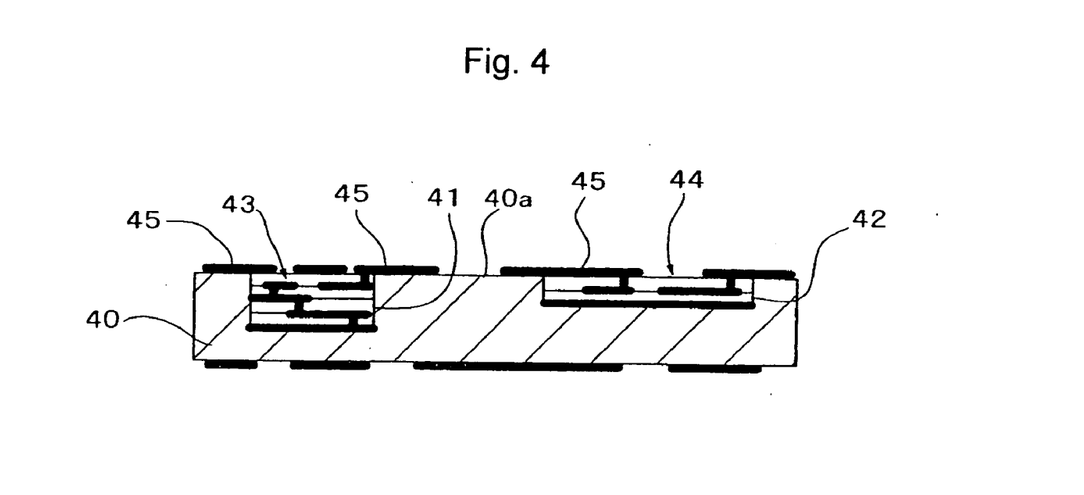
FIG. 4 is a diagram showing the configuration of another embodiment of a circuit formation part according to the present invention.
Figure 5:
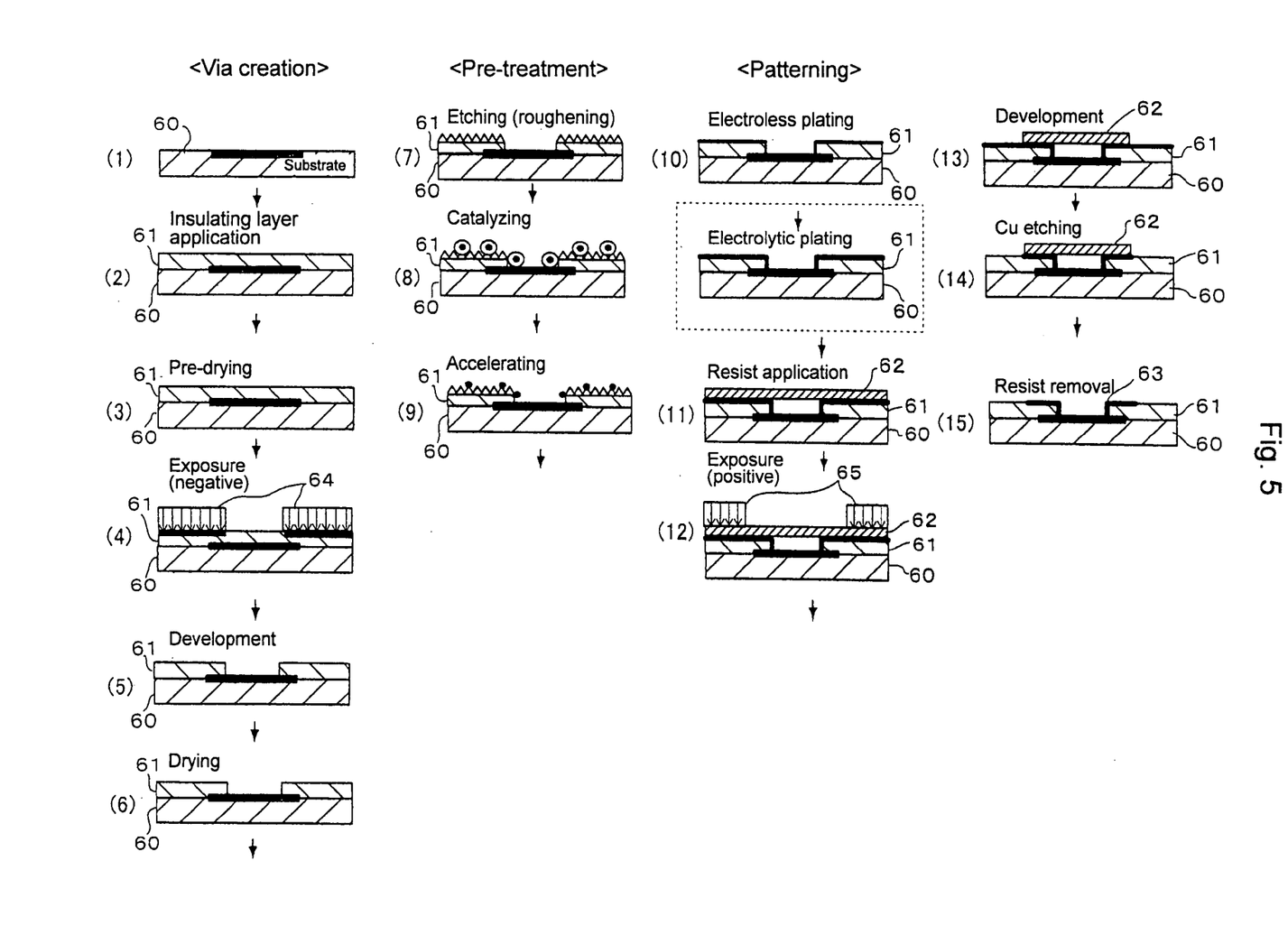

In addition, two recesses 41 and 42 are created in polymeric mold 40 (mold gained by filling polymeric material with inorganic filler and by using injection molding) in the circuit formation part shown in FIG. 4 wherein multi-layered circuit formation portions 43 and 44 are formed inside of these recesses 41 and 42. Thus, multi-layered circuit formation portions 43 and 44 have the same configuration as of the above described multi-layered circuit formation portion 38 and can be manufactured according to the same manufacturing (formation) method.

Furthermore, a land 45 is formed on top portion 40a of polymeric mold 40 so as to be connected to multi-layered circuit formation portions 43 and 44 created in recesses 41 and 42.

INDUSTRIAL APPLICABILITY

As described above in accordance with the circuit formation part according to the present invention, polymeric material filled with inorganic filler is diluted with a solvent and is applied to a base for resin application that includes a polymeric mold and is dried so as to form an insulating layer and, thereby, electroless plating or electrolytic plating become possible by means of a surface treatment with a laser and, therefore, a multi-layered substrate or a circuit formation part can be formed by using this electroless plating or electrolytic plating as a circuit pattern.

In addition, in accordance with a circuit formation part according to the present invention a multi-layered, even of more than three layers, circuit configuration having an arbitrary circuit formation can be gained that can easily be reduced in size and in weight, that can easily be increased in density and that has excellent EMC characteristics.

In addition, in accordance with a manufacturing method for a circuit formation part according to the present invention, a circuit forming part having an arbitrary circuit formation and having a three-dimensional multi-layered, even of more than three layers, circuit can easily be manufactured at a low cost.

The invention claimed is:

1. A manufacturing method for a circuit comprising:
   forming an insulating layer by:
   applying a polymeric material, which has been diluted with a solvent and filled with inorganic filler, to a base for resin application that includes a polymeric mold; and
   drying the polymeric mold;
   creating a circuit formation pattern and a via hole in the insulating layer by a laser treatment, which induces at least one of a positive potential and a conductive state in the circuit formation pattern and the via hole; and
   forming a circuit solely by plating the circuit formation pattern and the via hole; and
   repeating the insulating layer formation step, circuit formation pattern creation step and the circuit formation step a plurality of times in the recited order, in order to completely form the circuit,
   wherein the inorganic filler is glass in a granular form or ceramic in a granular form having a diameter of from 0.1 μm to 10 μm of which the amount added to the polymeric material is from 10 wt. % to 50 wt. %, and
   wherein the laser has a wavelength of 600 nm, or less, and the total energy of irradiated laser is from about 10 J/cm$^2$ to about 500 J/cm$^2$.

2. The manufacturing method for a circuit according to claim 1, wherein the circuit comprises a multi-layered substrate.

3. The manufacturing method for a circuit according to claim 1, wherein the plating is an electroless plating that is carried out by immersing the insulating layer in an electroless plating liquid after the insulating layer has been irradiated with laser so that the positive surface potential is created in the circuit formation pattern portion irradiated with the laser and, then, a catalyst for the electroless plating is deposited on the circuit formation pattern irradiated with the laser.

4. A method according to claim 3, wherein the electroless plating liquid includes anionic Pd compounds or Pd colloids.

5. The manufacturing method for a circuit according to claim 1, wherein the plating is electrolytic plating and is carried out by immersing the insulating layer in an electrolytic plating liquid after the insulating layer has been irradiated with the laser so that the portion irradiated with the laser is converted to a conductive state.

6. The manufacturing method for a circuit formation part according to claim 1, wherein the polymeric material of the polymeric mold is liquid crystal polymer, polyethersulfone, polybutylene terephthalate, polycarbonate, polyphenylene ether, polyphenylene oxide, polyacetal, polyethylene terephthalate, polyaniide, acrylonitrile-butadiene-styrene (ABS), polyphenylene sulfide, polyetherimide, polyetheretherketone, polysulfone, polyimide, epoxy resin or a composite resin thereof.

7. A method of forming a circuit comprising:
   applying a polymeric material, which has been diluted with a solvent and filled with inorganic filler, to a base for resin application that includes a polymeric mold, to thereby form a polymeric substrate;
   irradiating the polymeric substrate with a laser to form a laser irradiated circuit pattern which is one of charged or electrically conductive; and
   plating the circuit pattern solely using one of electroless or electrolytic plating to completely form the circuit,
   wherein the inorganic filler is glass in a granular form or ceramic in a granular form having a diameter of from 0.1 μm to 10 μm of which the amount added to the polymeric material is from 10 wt. % to 50 wt. %, and
   wherein the laser has a wavelength of 600 nm, or less, and the total energy of irradiated laser is from about 10 J/cm$^2$ to about 500 J/cm$^2$.

8. A method according to claim 7, further comprising:
   forming a via hole using the laser irradiation used to irradiate the circuit pattern, and
   plating the wall of the via hole which is one of charged or electrically conductive due to the laser irradiation by one of electroless or electrolytic plating, the wall of the via hole being plated solely by the one of electroless or electrolytic plating, to completely form the plated wall of the via hole.

9. A method according to claim 8, wherein the electroless or electrolytic plating is performed using anionic Pd compounds or Pd colloids.

* * * * *